US010950592B2

(12) United States Patent
Ding et al.

(10) Patent No.: US 10,950,592 B2
(45) Date of Patent: Mar. 16, 2021

(54) DISPLAY PANEL AND METHOD OF FABRICATING THE SAME, DISPLAY DEVICE

(71) Applicant: BOE TECHNOLOGY GROUP CO., LTD., Beijing (CN)

(72) Inventors: Xiaoliang Ding, Beijing (CN); Xue Dong, Beijing (CN); Haisheng Wang, Beijing (CN); Xiaochuan Chen, Beijing (CN); Likai Deng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 18 days.

(21) Appl. No.: 16/414,773

(22) Filed: May 16, 2019

(65) Prior Publication Data

US 2020/0083205 A1 Mar. 12, 2020

(30) Foreign Application Priority Data

Sep. 10, 2018 (CN) ......................... 201811051291.1

(51) Int. Cl.
*H01L 25/18* (2006.01)
*H01L 23/00* (2006.01)
*H01L 25/00* (2006.01)

(52) U.S. Cl.
CPC .............. *H01L 25/18* (2013.01); *H01L 24/05* (2013.01); *H01L 24/32* (2013.01); *H01L 25/50* (2013.01);

(Continued)

(58) Field of Classification Search
CPC . H01L 2224/05623; H01L 2224/05624; H01L 2224/05639; H01L 24/05; H01L 24/32; H01L 25/18; H01L 25/50
See application file for complete search history.

(56) References Cited

U.S. PATENT DOCUMENTS 6,844,672 B2 * 1/2005 Yamazaki ............. H01L 51/524 313/498
2007/0080377 A1 * 4/2007 Sung .................. H01L 51/5234 257/253

(Continued)

FOREIGN PATENT DOCUMENTS

CN 1967864 A 5/2007
CN 106405892 A 2/2017

(Continued)

OTHER PUBLICATIONS

Office Action issued in corresponding Chinese Patent Application No. 201811051291.1, dated Mar. 12, 2020.

*Primary Examiner* — Shaun M Campbell
(74) *Attorney, Agent, or Firm* — McDermott Will & Emery LLP

(57) ABSTRACT

A display panel and a method of fabricating the same, and a display device are provided, the display panel includes a display substrate a package substrate opposite to each other, the display substrate includes a first base substrate; and a first electrode, an electroluminescent layer and a second electrode disposed on the first base substrate in sequence; the package substrate includes a second base substrate; and a conductive layer on the second base substrate, the conductive layer and the second electrode facing towards each other; the display panel further includes a conductive adhesive between the second electrode and the conductive layer, the conductive adhesive is configured to bond the display substrate with the package substrate, and electrically connect the second electrode with the conductive layer.

19 Claims, 4 Drawing Sheets

(52) U.S. Cl.
CPC ............... *H01L 2224/05623* (2013.01); *H01L 2224/05624* (2013.01); *H01L 2224/05639* (2013.01)

(56) References Cited

U.S. PATENT DOCUMENTS

| | | | | |
|---|---|---|---|---|
| 2008/0218066 A1* | 9/2008 | Kim | H01L 51/5231 | 313/504 |
| 2014/0125643 A1* | 5/2014 | Kuo | H01L 27/3269 | 345/207 |
| 2014/0339521 A1* | 11/2014 | Ozawa | H01L 51/5253 | 257/40 |
| 2015/0042694 A1* | 2/2015 | Lee | G09G 3/3225 | 345/690 |
| 2016/0155386 A1* | 6/2016 | Shang | G09G 3/3233 | 345/690 |
| 2019/0102018 A1 | 4/2019 | Qin et al. | | |

FOREIGN PATENT DOCUMENTS

| | | |
|---|---|---|
| CN | 107591425 A | 1/2018 |
| CN | 107632738 A | 1/2018 |

* cited by examiner

DISPLAY PANEL AND METHOD OF FABRICATING THE SAME, DISPLAY DEVICE

CROSS-REFERENCE TO RELATED APPLICATION

This application claims the benefit of Chinese Patent Application No. 201811051291.1 filed on Sep. 10, 2018 in the State Intellectual Property Office of China, the whole disclosure of which is incorporated herein by reference.

TECHNICAL FIELD

The present disclosure relates to the field of display technology, and in particular, to a thin display panel and a method of fabricating the same, and a display device.

BACKGROUND

An organic light-emitting diode (OLED) display panel is a display device different from a conventional liquid crystal display (LCD), and has the advantages of active light emission, good temperature characteristics, low power consumption, fast response, flexibility, and low cost, being ultra-thin, and so on. Therefore, it has become one of the important development directions of the new generation of display devices, and has received more and more attention.

SUMMARY

Some embodiments of the present disclosure provide a display panel comprising: a display substrate comprising: a first base substrate; and a first electrode, an electroluminescent layer and a second electrode on the first base substrate, the first electrode, the electroluminescent layer and the second electrode being sequentially away from the first base substrate; a package substrate opposite to the display substrate, comprising: a second base substrate; and a conductive layer on the second base substrate, the conductive layer and the second electrode facing towards each other; and a conductive adhesive between the second electrode and the conductive layer, wherein the conductive adhesive is configured to bond the display substrate with the package substrate, and electrically connect the second electrode with the conductive layer.

In some embodiments, the package substrate further comprises: a photodetecting layer on a side of the conductive layer adjacent to the second base substrate, wherein the photodetecting layer is configured to receive light generated by the electroluminescent layer and transmitted through the second electrode.

In some embodiments, the photodetecting layer comprises a plurality of photosensors arranged in an array.

In some embodiments, the first electrode comprises a plurality of first sub-electrodes arranged in an array, the electroluminescent layer comprises a plurality of electroluminescent sub-layers, and the plurality of first sub-electrodes, the plurality of electroluminescent sub-layers, and the plurality of photosensors are disposed in one-to-one correspondence with one another.

In some embodiments, orthographic projections of the plurality of electroluminescent sub-layers on the first base substrate substantially coincides with orthographic projections of the plurality of photosensors on the first base substrate, respectively.

In some embodiments, the conductive layer is in a shape of grid, and an orthographic projection of the conductive layer on the second base substrate does not overlap an orthographic projection of the photodetecting layer on the second base substrate.

In some embodiments, the conductive layer in the shape of grid has a plurality of openings, and orthographic projections of the plurality of photosensors on the second base substrate fall within orthographic projections of the plurality of openings on the second base substrate, respectively.

In some embodiments, the conductive layer is made of metal.

In some embodiments, the package substrate further comprises an auxiliary electrode electrically connected to the conductive layer, the auxiliary electrode being on the side of the conductive layer adjacent to the second base substrate, or on a side of the conductive layer away from the second base substrate, the auxiliary electrode being a transparent and integral continuous electrode layer.

In some embodiments, a transmittance of the conductive layer is not equal to 0 and the conductive layer is an integral continuous electrode layer.

In some embodiments, the conductive adhesive comprises a plurality of conductive particles, and the conductive layer is electrically connected to the second electrode through the plurality of conductive particles.

In some embodiments, material of the plurality of conductive particles comprises gold; and/or each of the plurality of conductive particles has a spherical shape.

In some embodiments, the conductive particles are uniformly distributed in the conductive adhesive.

In some embodiments, the conductive adhesive further comprises a plurality of supporting particles, material of the plurality of supporting particles comprises an organic polymer material, and/or each of the plurality of supporting particles has a spherical shape.

In some embodiments, the supporting particles are uniformly distributed in the conductive adhesive.

In some embodiments, the second electrode is a cathode and is an integral continuous electrode layer.

In some embodiments, the second electrode has a thickness of from 10 to 1000 angstroms; and/or material of the second electrode comprises one of magnesium, aluminum or silver.

In some embodiments, the package substrate further comprises a transparent insulating layer between the conductive layer and the photodetecting layer.

In some embodiments, the display panel comprises an OLED display panel, the electroluminescent layer comprises an organic light-emitting layer, light generated by the organic light-emitting layer being emitted from the first base substrate to achieve display.

Some embodiment of the present disclosure provide method of fabricating a display panel, comprising: providing a first base substrate; forming a first electrode, an electroluminescent layer and a second electrode on the first base substrate in sequence to form a display substrate; providing a second base substrate; forming a conductive layer on the second base substrate to form a package substrate; and bonding the display substrate with the package substrate by a conductive adhesive such that the conductive layer is electrically connected with the second electrode.

BRIEF DESCRIPTION OF THE DRAWINGS

The drawings are used to provide a further understanding of the technical solutions of the present disclosure, and constitute a part of the present disclosure. The drawings are used together with the embodiments of the present disclosure to explain the technical solutions of the present disclosure, and do not constitute a limitation of the technical solutions of the present disclosure.

DETAILED DESCRIPTION OF THE EMBODIMENTS

Figure 1:
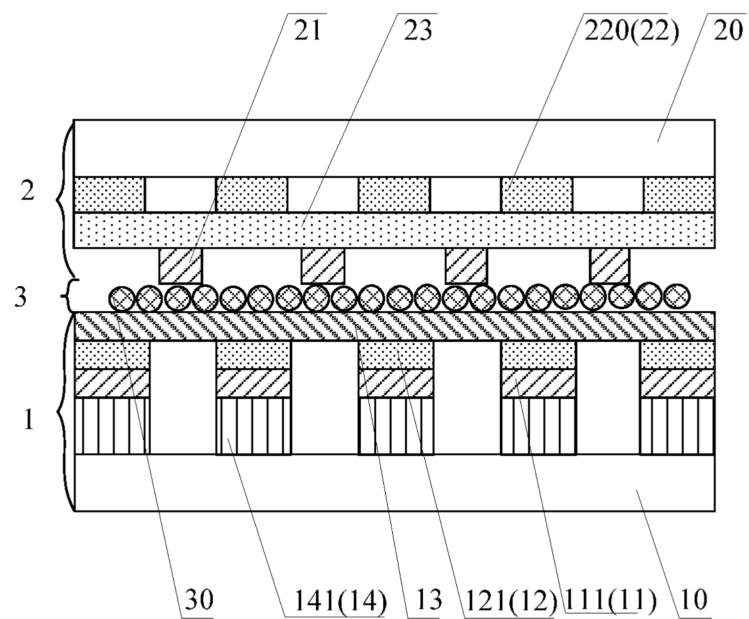
FIG. 1 is a schematic cross-sectional structural view of an OLED display panel according to some embodiments of the present disclosure.

In order to make the objects, technical solutions and advantages of the present disclosure more clear, the embodiments of the present disclosure will be described in detail below with reference to the accompanying drawings. It should be noted that, in the case of no conflict, embodiments of the present disclosure and the features therein may be combined with each other.

Unless otherwise defined, technical terms or scientific terms used in the embodiments of the present disclosure should be of ordinary meaning understood by those skilled in the art. The words “first”, “second” and similar terms used in the embodiments of the present disclosure do not denote any order, quantity, or importance, but are merely used to distinguish different components. The word “comprising” or “comprise(s)” or the like mean that the element or item that precedes the word includes the element or the item that is recited after the word and its equivalent, and does not exclude other element or item. The word “connecting” or “connected” or the like is not limited to physical or mechanical connections, but may include electrical connections, whether direct or indirect. “upper”, “lower”, “left”, “right”, etc. are only used to indicate relative positional relationships, and when the absolute position of the object to be described is changed, the relative positional relationship may also change accordingly.

In the related art, the OLED display panel can be classified into three types according to the direction of light output: a bottom emission OLED display panel, a top emission OLED display panel, and a double-sided emission OLED display panel. The bottom emission OLED display panel comprises: a package substrate and an OLED display substrate, and the bottom emission refers to that light emitted by the OLED display substrate is emitted from a side of the OLED display substrate away from the package substrate. In order to ensure the display effect of the OLED display panel, the bottom emission OLED display panel can be provided with photoelectric sensors on the package substrate and a light-transmitting cathode, so that the photoelectric sensors can sense light emitted by the OLED display substrate, and detect the OLED luminous intensity in real time, thereby realizing optical compensation for the OLED display panel.

According to the research of the inventors, in the existing bottom emission OLED display panel, the cathode has a certain transmittance by reducing the deposition thickness thereof. However, the decrease in the thickness of the cathode may cause an increase in the resistance of the cathode, thereby causing a large voltage drop (IR Drop), and resulting in uneven display brightness of the OLED display panel.

Some embodiments of the present disclosure provide a display panel including a display substrate and a package substrate disposed opposite to each other. The display substrate includes a first base substrate; and a first electrode, an electroluminescent layer, and a second electrode sequentially disposed on the first base substrate. The package substrate includes a second base substrate; and a conductive layer disposed on the second base substrate. The second electrode and the conductive layer face each other. The display panel further includes a conductive adhesive disposed between the second electrode and the conductive layer, the conductive adhesive is configured to bond the display substrate with the package substrate, and electrically connect the second electrode with the conductive layer. The conductive layer is formed in parallel with the second electrode to avoid a large voltage drop (IR Drop), which overcomes the problem of uneven display brightness of the display panel.

The embodiments of the present disclosure are exemplified by the display panel being an OLED display panel. It can be understood by those skilled in the art that the display panel may further include a QLED (Quantum Dot Light-Emitting Diode) display panel or a PLED (Polymer Light-Emitting Diode) display panel, etc.

FIG. 1 is a schematic cross-sectional view of an OLED display panel according to some embodiments of the present disclosure. As shown in FIG. 1, an OLED display panel provided by some embodiments of the present disclosure includes: an OLED display substrate 1 and a package substrate 2 disposed opposite to each other. The OLED display substrate includes: a first base substrate 10; and a first electrode 11, an organic light-emitting layer 12 and second electrode 13 sequentially disposed on the first base substrate 10. The package substrate 2 includes: a second base substrate 20; and a conductive layer 21 disposed on the second base substrate 20. The second electrode 13 and the conductive layer 21 are disposed to face each other. The OLED display panel further includes a conductive adhesive 3 disposed between the second electrode 13 and the conductive layer 21, and a surface of the OLED display substrate 1 on which the second electrode 13 is disposed and a surface of the package substrate 2 on which the conductive layer 21 is disposed are bonded by the conductive adhesive 3.

The conductive adhesive 3 electrically connects the second electrode 13 to the conductive layer 21. Specifically, the conductive adhesive 3 includes conductive particles 30, and the conductive layer 21 is electrically connected to the second electrode 13 through the conductive particles 30.

In some embodiments, the OLED display panel is a bottom emission OLED display panel, that is, light emitted by the organic light-emitting layer is emitted from a side of the OLED display substrate away from the package substrate.

Specifically, as shown in FIG. 1, the OLED display substrate 1 further includes a thin film transistor array layer 14 disposed on a side of the first electrode 11 adjacent to the first base substrate 10, and the thin film transistor array layer 14 includes a plurality of thin film transistors 141 arranged in an array. The first electrode 11 includes a plurality of first sub-electrodes 111 arranged in an array. The plurality of first sub-electrodes 111 are in one-to-one correspondence with the plurality of thin film transistors 141, and each of the first sub-electrodes 111 is connected to a drain electrode of the corresponding thin film transistor 141.

Optionally, the first base substrate 10 may be a rigid substrate or a flexible substrate, the rigid substrate may be made of, but not limited to, one or more of glass or metal; the flexible substrate may be made of, but not limited to, one or more of polyethylene terephthalate, ethylene terephthalate, polyether-ether-ketone, polystyrene, polycarbonate, polyarylate, polyarylester, polyimide, polyvinyl chloride, polyethylene or textile fiber.

Optionally, the second base substrate 20 may be a rigid substrate or a flexible substrate, the rigid substrate may be made of, but not limited to, one or more of glass or metal; the flexible substrate may be made of, but not limited to, one or more of polyethylene terephthalate, ethylene terephthalate, polyether-ether-ketone, polystyrene, polycarbonate, polyarylate, polyarylester, polyimide, polyvinyl chloride, polyethylene or textile fiber.

Specifically, the first electrode 11 is an anode, and the second electrode 13 is a cathode, alternatively, the first electrode 11 is a cathode, and the second electrode 13 is an anode. In some embodiments, the second electrode 13 as a cathode is an integral continuous electrode layer.

Optionally, the conductive adhesive 3 can be made by incorporating conductive particles into an adhesive, and the adhesive is a transparent adhesive such as dam glue, filling glue, surface glue, special adhesive for bonding transparent optical components or optical transparent adhesive, but is not limited to the above adhesive materials. Other transparent organic adhesive materials known in the prior art may also be used, and will not be further described herein. The conductive adhesive 3 can be set by using a dam filling package or a surface package.

In some embodiments, the conductive layer 21 is electrically connected to the second electrode 13 through the conductive particles 30, which is equivalent to a resistor connected in parallel to the second electrode 13, so that the resistance of an electrode layer including the entire conductive layer 21 and the second electrode 13 is reduced, thereby overcoming the problem of IR Drop.

The OLED display panel provided by the embodiments of the present disclosure includes an OLED display substrate and a package substrate opposite to each other. The OLED display substrate includes: a first base substrate; and a first electrode, a second electrode, and an organic light-emitting layer sequentially disposed on the first base substrate. The package substrate includes: a second base substrate; and a conductive layer disposed on the second base substrate. A surface of the OLED display substrate on which the second electrode is disposed and a surface of the package substrate on which the conductive layer is disposed are bonded by a conductive adhesive. The conductive adhesive includes conductive particles, and the conductive layer is electrically connected to the second electrode through the conductive particles. In the embodiments of the present disclosure, the conductive adhesive comprises conductive particles, such that the conductive layer and the second electrode are electrically connected, and the conductive layer and the second electrode together act as an entire electrode layer, thereby reducing the resistance of the electrode layer, reducing IR drop, and ensuring brightness uniformity of the OLED display panel.

Optionally, as shown in FIG. 1, the package substrate in the OLED display panel provided by the embodiments of the present disclosure further includes: a photodetecting layer 22 and a transparent insulating layer 23, the transparent insulating layer 23 is configured to electrically insulate the photodetecting layer 22 from the conductive layer 21.

Specifically, the photodetecting layer 22 is disposed on a side of the conductive layer 21 adjacent to the second base substrate 20, and the transparent insulating layer 23 is disposed between the photodetecting layer 22 and the conductive layer 21.

Optionally, the transparent insulating layer 23 is made of a transparent insulating material such as silicon oxide, silicon nitride, or a composite of silicon oxide and silicon nitride, which is not limited in the embodiments of the present disclosure.

Figure 2:
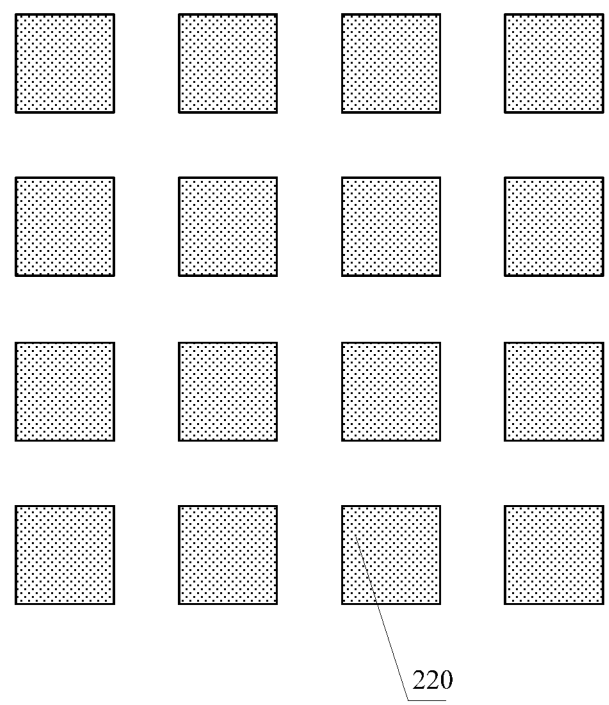
FIG. 2 is a schematic plan view of a photodetecting layer according to some embodiments of the present disclosure.

FIG. 2 is schematic plan view of a photodetecting layer according to some embodiments of the present disclosure. As shown in FIG. 2, the photodetecting layer 22 in the embodiments of the present disclosure includes: photosensors 220 arranged in an array.

The photosensors 220 are configured to receive light emitted by the organic light-emitting layer and transmitted through the cathode 13, and convert received optical signals into electrical signals, so as to monitor the luminous intensity of the OLEDs.

Specifically, there may be a plurality of the photosensors 220, and the number of the photosensors 220 may be dependent on actual needs, and the embodiments of the present disclosure do not limit this.

In some embodiments, as shown in FIG. 1 and FIG. 2, the organic light-emitting layer 12 includes a plurality of light-emitting sub-layers 121, and the plurality of first sub-electrodes 111 are in one-to-one correspondence with the plurality of light-emitting sub-layers 121. The plurality of first sub-electrodes 111, the plurality of light-emitting sub-layers 121 and the second electrode 13 together constitute a plurality of OLEDs arranged in an array. The plurality of photosensors 220 are in one-to-one correspondence with the plurality of OLEDs. Orthographic projections of the plurality of first sub-electrodes 111 on the first base substrate 10 substantially coincide with orthographic projections of the plurality of photosensors 220 on the first base substrate 10, respectively, and orthographic projections of the plurality of light-emitting sub-layers 121 on the first base substrate 10 substantially coincide with the orthographic projections of the plurality of photosensors 220 on the first base substrate 10, respectively. Each of the photosensors 220 detects the luminous intensity of the corresponding OLED. When the luminous intensity of the OLED is abnormal, for example below a threshold, the corresponding OLED may be optically compensated, for example by increasing the input voltage signal of the corresponding OLED.

Optionally, the second electrode 13 is an integral continuous electrode layer covering the entire first base substrate 10, and the second electrode 13 has a thickness of from 10 to 1000 angstroms, so that the transmittance of the second electrode layer is not equal to 0. The light incident on the second electrode 13 from the organic light-emitting layer 12 may be at least partially transmitted through the second electrode 13.

Optionally, the material of the second electrode 13 includes: one of magnesium, aluminum, or silver, and the light transmittance thereof is, for example, 1% to 10%, as long as the second electrode can transmit light. The embodiments of the present disclosure do not limit this.

In the embodiments, the second electrode is capable of transmitting light emitted from the organic light-emitting layer, so that the photosensors can sense the light emitted by the organic light-emitting layer, and detect the luminous intensity of the OLEDs in real time, thereby achieving optical compensation for the OLEDs.

Optionally, in order to reduce the electrical resistance of the entire electrode layer, the conductive layer is made of a metal material having a high electrical conductivity. Specifically, the conductive layer 21 is made of copper, molybdenum-aluminum-molybdenum alloy or titanium-aluminum-titanium alloy.

Figure 3:
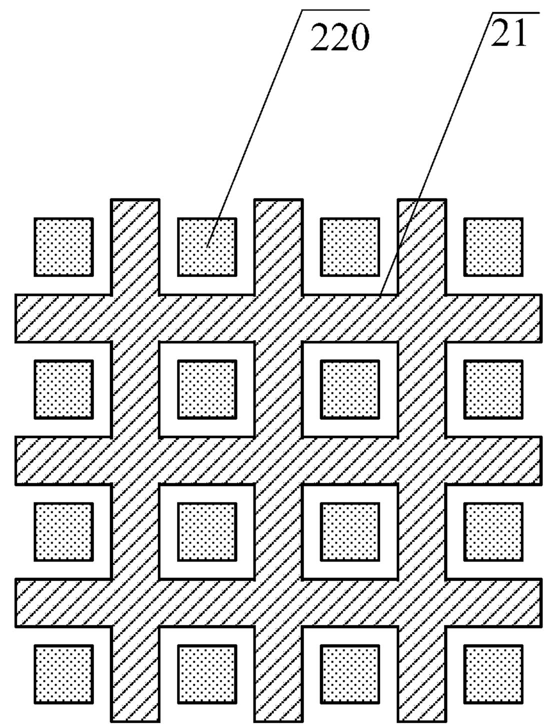
FIG. 3 is a schematic plan view of both a conductive layer and a photodetecting layer according to some embodiments of the present disclosure.

In some embodiments, FIG. 3 is a schematic plan view of both a conductive layer and a photodetecting layer according to some embodiments of the present disclosure. As shown in FIG. 3, the transmittance of the conductive layer 21 in the embodiments is equal to 0, that is, the conductive layer 21 is opaque.

In order to ensure that the light emitted from the organic light-emitting layer 12 can be sensed by the photosensors, the conductive layer 21 has a shape of grid, and there is no overlapping region between an orthographic projection of the conductive layer 21 on the second base substrate 20 and an orthographic projection of the photodetecting layer 22 on the second base substrate 20. It should be noted that FIG. 1 is an example in which the conductive layer is in the shape of grid.

Optionally, as shown in FIGS. 1 and 3, the conductive layer 21 in the shape of grid includes a plurality of openings, and the orthographic projections of the plurality of photosensors 220 on the second base substrate 20 fall within orthographic projections of the plurality of openings on the second base substrate 20, respectively.

Figure 4:
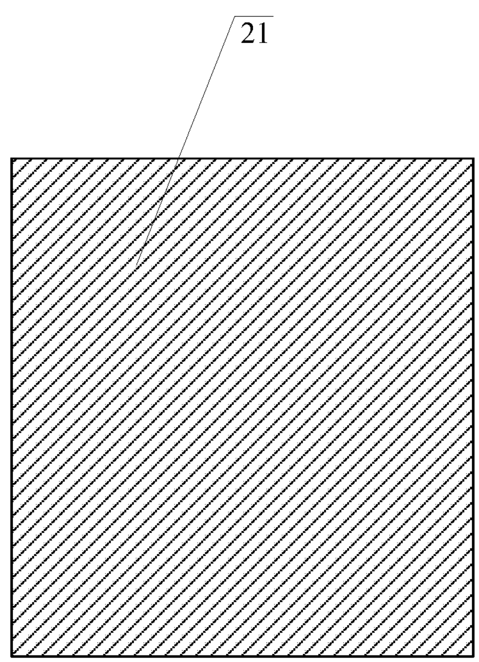
FIG. 4 is a schematic plan view of a conductive layer provided by some embodiments of the present disclosure.

In some embodiments, FIG. 4 is a schematic plan view of a conductive layer according to some embodiments of the present disclosure. As shown in FIG. 4, the transmittance of the conductive layer 21 in the embodiments is not equal to 0, that is, the conductive layer 21 is at least partially transparent.

Specifically, the conductive layer 21 is an integral continuous transparent electrode layer.

In some embodiments, the conductive layer 21 is an integral continuous transparent electrode layer, and the transparent insulating layer 23 disposed between the conductive layer 21 and the photodetecting layer 22 may be omitted. In this case, the conductive layer may serve as a common electrode of the plurality of photosensors 220 in the photodetecting layers 22.

Figure 5:
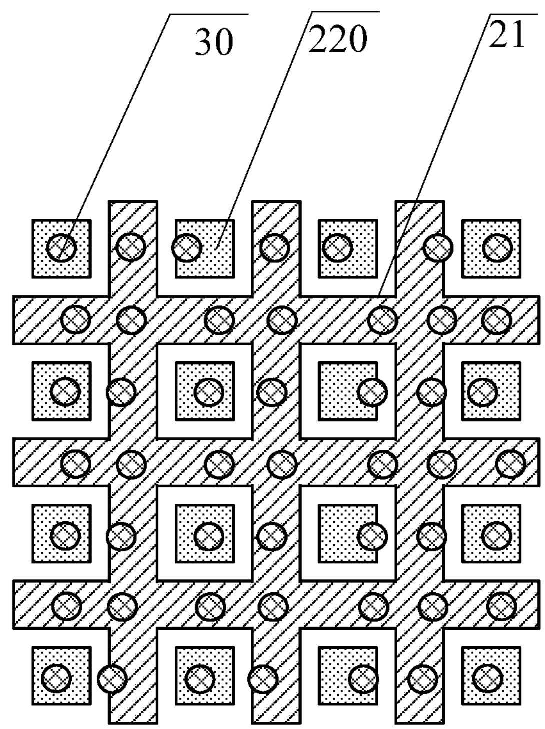
FIG. 5 is a schematic plan view of an OLED display panel according to some embodiments of the present disclosure, in which only a photodetecting layer, a conductive layer in a shape of grid and conductive particles are shown.

FIG. 5 is a schematic plan view of an OLED display panel according to some embodiments of the present disclosure, in which only a photodetecting layer, a conductive layer in a shape of grid and conductive particles are shown. As shown in FIGS. 1 and 5, the conductive particles 30 are evenly distributed on the conductive adhesive 3.

Optionally, the material of the conductive particles 30 includes gold, and the shape thereof may be spherical, the embodiments of the present disclosure are not limited thereto, as long as it can conduct electricity. It should be noted that FIG. 5 is an example in which the conductive layer is in the shape of grid. The conductive layer may also be an integral continuous transparent conductive layer, which is not limited in the embodiments of the present disclosure.

Figure 6:
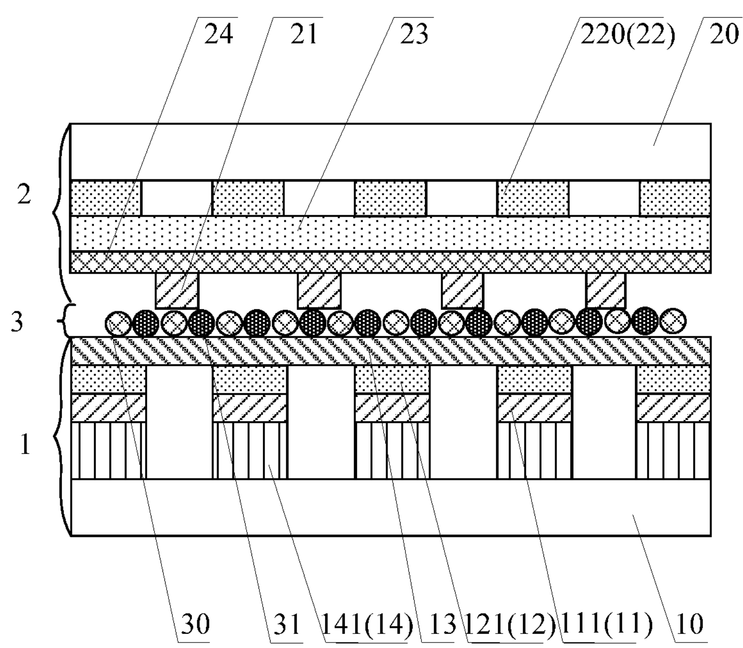
FIG. 6 is a schematic cross-sectional structural view of an OLED display panel according to some embodiments of the present disclosure.

FIG. 6 is a schematic cross-sectional view of an OLED display panel according to some embodiments of the present disclosure. As shown in FIG. 6, when the conductive layer is opaque and has a grid-like shape, the package substrate 2 in the OLED display panel provided by the embodiments of the present disclosure further includes the auxiliary electrode 24 in order to increase a conductive area between the conductive particles and the conductive layer.

The auxiliary electrode 24 may be disposed between the transparent insulating layer 23 and the conductive layer 21, or may be disposed on a side of the conductive layer 21 away from the second base substrate 20. FIG. 6 is an example in which the auxiliary electrode 24 is disposed between the transparent insulating layer 23 and the conductive layer 21, and the embodiments of the present disclosure do not limit this.

Specifically, the auxiliary electrode 24 is a transparent electrode. Optionally, the auxiliary electrode 24 is an integral transparent electrode layer.

Figure 7:
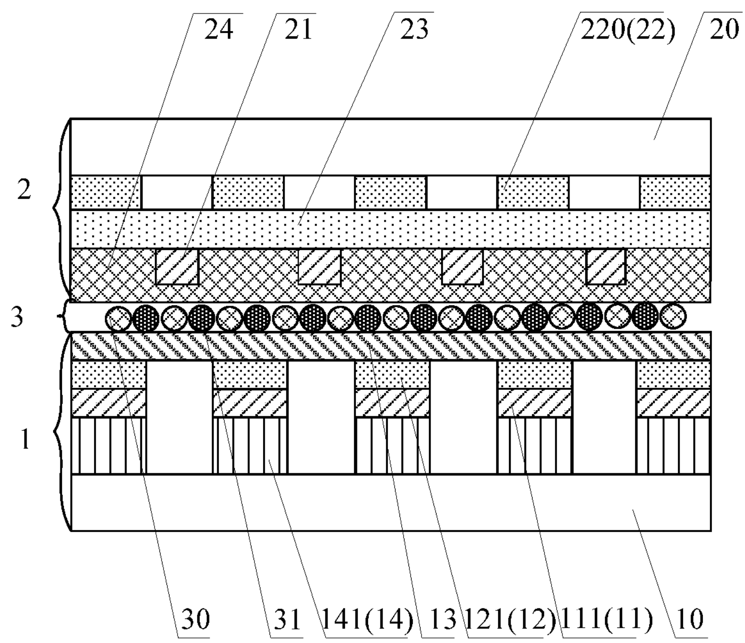
FIG. 7 is a schematic cross-sectional structural view of an OLED display panel according to some embodiments of the present disclosure.

Alternatively, when the auxiliary electrode 24 is disposed on the side of the conductive layer 21 away from the second base substrate 20, as shown in FIG. 7, the auxiliary electrode 24 covers the conductive layer 21.

Optionally, the auxiliary electrode 24 is made of a transparent conductive material, the transparent conductive material comprises one or more of Fluorine-doped Tin Oxide (FTO), Indium Tin Oxide (ITO), Indium-doped Zinc Oxide (IZO), Aluminium Zinc Oxide (AZO), nanotubes or graphene, etc., which are not limited in the embodiments of the present disclosure.

Optionally, as shown in FIG. 6, the conductive adhesive 3 further includes a plurality of supporting particles 31.

Specifically, the material of the supporting particles 31 includes an organic polymer material having elasticity.

Optionally, each of the supporting particles 31 has a spherical shape, but is not limited thereto. The embodiments of the present disclosure do not limit this.

Optionally, the supporting particles 31 are uniformly distributed in the conductive adhesive 3.

In the embodiments, the supporting particles 31 can maintain a cell gap of the OLED display panel and ensure the uniformity of the cell gap of the OLED display panel. The supporting particles 31 further can prevent the second electrode, the conductive layer or the auxiliary electrode from being damaged during a process of pressing the OLED display panel, thereby ensuring the performance of OLED display panel.

Figure 8:
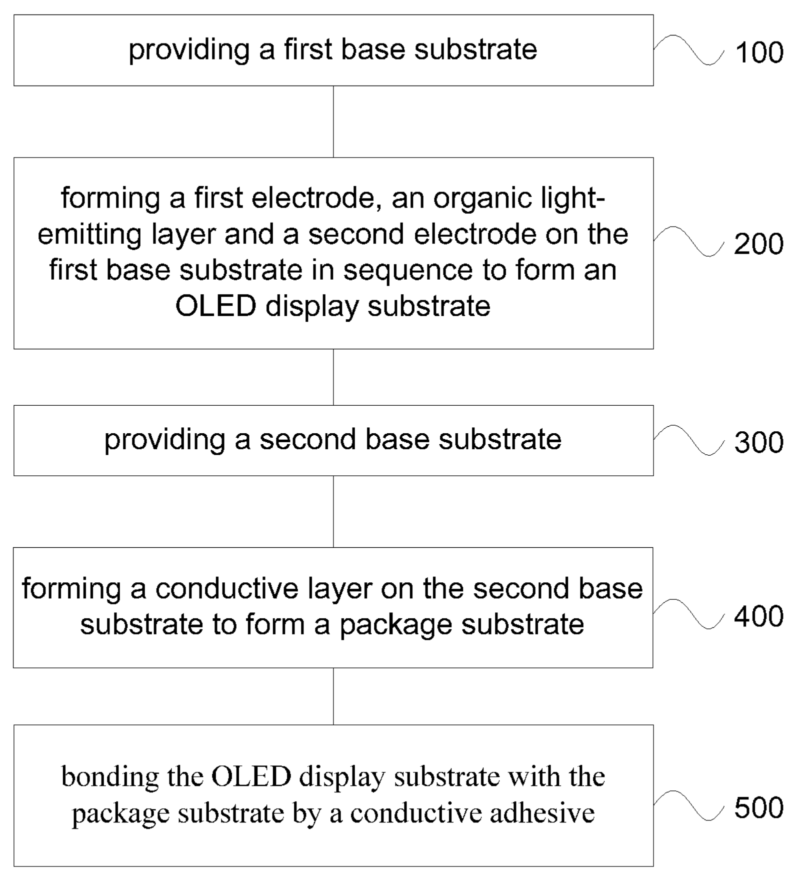
FIG. 8 is a flowchart showing a method of fabricating an OLED display panel according to some embodiments of the present disclosure.

Based on the inventive concepts of the foregoing embodiments, some embodiments of the present disclosure further provides a method for fabricating an OLED display panel, and FIG. 8 is a flowchart showing a method of fabricating an OLED display panel according to some embodiments of the present disclosure. As shown in FIG. 8, the method of fabricating the OLED display panel includes the following steps:

step 100: providing a first base substrate;

step 200: forming a first electrode, an organic light-emitting layer and a second electrode on the first base substrate in sequence to form an OLED display substrate;

step 300: providing a second base substrate;

step 400: forming a conductive layer on the second base substrate to form a package substrate; and step 500: bonding the OLED display substrate with the package substrate by a conductive adhesive such that the conductive layer is electrically connected to the second electrode.

In the step 100, optionally, the first base substrate may be a rigid substrate or a flexible substrate, the rigid substrate may be made of, but not limited to, one or more of glass or metal; the flexible substrate may be made of, but not limited to, one or more of polyethylene terephthalate, ethylene terephthalate, polyether-ether-ketone, polystyrene, polycarbonate, polyarylate, polyarylester, polyimide, polyvinyl chloride, polyethylene or textile fiber.

In the step 200, specifically, the first electrode is an anode, and the second electrode is a cathode, alternatively the first electrode is a cathode, and the second electrode is an anode.

Optionally, the second electrode is an integral continuous electrode layer covering the entire first base substrate, and the second electrode has a thickness of from 10 to 1000 angstroms.

Optionally, the material of manufacturing the second electrode includes: one of magnesium, aluminum, or silver, and the light transmittance thereof is, for example, 1% to 10%, as long as the second electrode can transmit light. The embodiments of the present disclosure do not limit this.

In the step 300, optionally, the second base substrate may be a rigid substrate or a flexible substrate, the rigid substrate may be made of, but not limited to, one or more of glass or metal; the flexible substrate may be made of, but not limited to, one or more of polyethylene terephthalate, ethylene terephthalate, polyether-ether-ketone, polystyrene, polycarbonate, polyarylate, polyarylester, polyimide, polyvinyl chloride, polyethylene or textile fiber.

In the step 400, optionally, in order to reduce the electrical resistance of the entire electrode layer, the conductive layer is made of a metal material having a high electrical conductivity. Specifically, the conductive layer is made of copper, molybdenum-aluminum-molybdenum alloy or titanium-aluminum-titanium alloy.

Optionally, the conductive layer may have a grid shape or be an integral continuous electrode layer. When the transmittance of the conductive layer is equal to 0, the conductive layer is in a shape of grid, and there is no overlapping region between an orthographic projection of the conductive layer on the second base substrate and an orthographic projection of the photodetecting layer on the second base substrate. When the transmittance of the conductive layer is not equal to 0, the conductive layer may be an integral continuous electrode layer.

In the step 500, for example, bonding a surface of the OLED display substrate on which the second electrode is disposed and a surface of the package substrate on which the conductive layer is disposed by the conductive adhesive, so that the conductive layer is electrically connected to the second electrode.

Optionally, the conductive adhesive comprises conductive particles, and the conductive layer is electrically connected to the second electrode through the conductive particles.

Optionally, the conductive adhesive can be made by incorporating conductive particles into an adhesive, and the adhesive is a transparent adhesive such as dam glue, filling glue, surface glue, special adhesive for bonding transparent optical components or optical transparent adhesive, but is not limited to the above adhesive materials. Other transparent organic adhesive materials known in the prior art may also be used, and will not be further described herein. The conductive adhesive can be set by using a dam filling package or a surface package.

In the embodiments, the conductive layer is electrically connected to the second electrode through the conductive particles, which is equivalent to equivalent to a resistor connected in parallel to the second electrode, so that the resistance of the electrode layer including the entire conductive layer and the second electrode is reduced, thereby reducing the IR Drop.

The method of fabricating the OLED display panel according to some embodiments of the present disclosure includes: providing a first base substrate, forming a first electrode, an electroluminescent layer and a second electrode on the first base substrate in sequence to form an OLED display substrate; providing a second base substrate; forming a conductive layer on the second base substrate to form a package substrate; and bonding a surface of the OLED display substrate on which the second electrode is disposed with a surface of the package substrate on which the conductive layer is disposed by a conductive adhesive. The conductive bonding adhesive includes conductive particles, and the conductive layer is electrically connected to the second electrode through the conductive particles. In the embodiments of the present disclosure, the conductive adhesive comprises conductive particles, such that the conductive layer and the second electrode are electrically connected, and the conductive layer and the second electrode together act as an entire electrode layer, thereby reducing the resistance of the electrode layer, reducing IR drop, and ensuring brightness uniformity of the OLED display panel.

Optionally, before the step 400, the method of fabricating the OLED display panel provided by the embodiments of the present disclosure further includes: forming a photodetecting layer on the second base substrate, the photodetecting layer including a plurality of photosensors arranged in an array; and forming a transparent insulating layer on the photodetecting layer.

Optionally, the transparent insulating layer made of a transparent insulating material such as silicon oxide, silicon nitride, or a composite of silicon oxide and silicon nitride, which is not limited in the embodiments of the present disclosure.

Specifically, there may be a plurality of the photosensors, and the number of the photosensors may be dependent on actual needs, and the embodiments of the present disclosure do not limit this.

Optionally, the method of fabricating the OLED display panel in the embodiments of the present disclosure further includes: forming an auxiliary electrode on a side of the conductive layer adjacent to the second base substrate or on a side of the conductive layer away from the second base substrate.

Specifically, the auxiliary electrode is a transparent electrode. Optionally, the auxiliary electrode is an integral continuous electrode layer.

Optionally, the auxiliary electrode is made of a transparent conductive material, the transparent conductive material comprises one or more of Fluorine-doped Tin Oxide (FTO), Indium Tin Oxide (ITO), Indium-doped Zinc Oxide (IZO), Aluminium Zinc Oxide (AZO), nanotubes or graphene, etc., which are not limited in the embodiments of the present disclosure.

In some embodiments, the conductive adhesive further includes a plurality of supporting particles.

Specifically, the material of the supporting particles includes an organic polymer material having elasticity.

Optionally, each of the supporting particles has a spherical shape, but is not limited thereto. The embodiments of the present disclosure do not limit this.

In the embodiments, the supporting particles can maintain a cell gap of the OLED display panel and ensure the uniformity of the cell gap of the OLED display panel. The supporting particles further can prevent the second electrode, the conductive layer or the auxiliary electrode from being damaged during a process of pressing the OLED display panel, thereby ensuring the performance of OLED display panel.

Based on the inventive concepts of the foregoing embodiments, some embodiment of the present disclosure further provides an OLED display device. The OLED display device provided by the embodiments of the present disclosure includes the OLED display panel in the foregoing embodiments.

Optionally, the OLED display device is a bottom emission OLED display device, the implementation principle and implementation effect thereof can be referred to the foregoing embodiments, and details are not described herein again.

Specifically, the OLED display device may be any product or component having a display function, such as a mobile phone, a tablet computer, a television, a display, a notebook computer, a digital photo frame, a navigator, etc., which is not limited in this embodiment.

The drawings of the present disclosure relate only to the structures involved in the embodiments of the present disclosure, and other structures may refer to conventional designs.

For the sake of clarity, in the drawings used to describe the embodiments of the present disclosure, the thicknesses and sizes of layers or microstructures are magnified. It will be understood that when an element such as a layer, a film, a region or a substrate is referred to as being "on" or "under" another element, the element may be "on" or "under" the another element directly, or there may be intermediate elements between the element and the another element.

In the case of no conflict, the embodiments of the present disclosure and the features in the embodiments may be combined with each other to obtain new embodiments.

The embodiments disclosed in the present disclosure are as described above, they are merely used to facilitate to understand the present disclosure, and are not intended to limit the present disclosure. Any modification or variation in the forms and details of the implementation may be made by those skilled in the art without departing from the spirit and scope of the present disclosure. The protection scope of the present disclosure is subject to the scope defined by the appended claims.

What is claimed is:

1. A display panel comprising:

a display substrate comprising:

a first base substrate; and a first electrode, an electroluminescent layer and a second electrode on the first base substrate, wherein the first electrode, the electroluminescent layer and the second electrode are sequentially away from the first base substrate;

a package substrate opposite to the display substrate, comprising:

a second base substrate; and a conductive layer on the second base substrate, the conductive layer and the second electrode facing towards each other; and a conductive adhesive between the second electrode and the conductive layer, wherein the conductive adhesive is configured to bond the display substrate with the package substrate, and electrically connect the second electrode with the conductive layer, wherein the package substrate further comprises:

a photodetecting layer on a side of the conductive layer adjacent to the second base substrate, wherein the photodetecting layer is configured to receive light generated by the electroluminescent layer and transmitted through the second electrode.

2. The display panel of claim 1, wherein the photodetecting layer comprises a plurality of photosensors arranged in an array.

3. The display panel of claim 2, wherein the first electrode comprises a plurality of first sub-electrodes arranged in an array, the electroluminescent layer comprises a plurality of electroluminescent sub-layers, and the plurality of first sub-electrodes, the plurality of electroluminescent sub-layers, and the plurality of photosensors are disposed in one-to-one correspondence with one another.

4. The display panel of claim 3, wherein orthographic projections of the plurality of electroluminescent sub-layers on the first base substrate substantially coincide with orthographic projections of the plurality of photosensors on the first base substrate, respectively.

5. The display panel of claim 2, wherein the conductive layer is in a shape of grid, and an orthographic projection of the conductive layer on the second base substrate does not overlap an orthographic projection of the photodetecting layer on the second base substrate.

6. The display panel of claim 5, wherein the conductive layer in the shape of grid has a plurality of openings, and orthographic projections of the plurality of photosensors on the second base substrate fall within orthographic projections of the plurality of openings on the second base substrate, respectively.

7. The display panel of claim 5, wherein the conductive layer is made of metal.

8. The display panel of claim 5, wherein the package substrate further comprises an auxiliary electrode electrically connected to the conductive layer, the auxiliary electrode being on the side of the conductive layer adjacent to the second base substrate, or on a side of the conductive layer away from the second base substrate, the auxiliary electrode being a transparent and integral continuous electrode layer.

9. The display panel of claim 2, wherein a transmittance of the conductive layer is not equal to 0 and the conductive layer is an integral continuous electrode layer.

10. The display panel of claim 1, wherein the conductive adhesive comprises a plurality of conductive particles, and the conductive layer is electrically connected to the second electrode through the plurality of conductive particles.

11. The display panel of claim 9, wherein material of the plurality of conductive particles comprises gold; and each of the plurality of conductive particles has a spherical shape.

12. The display panel of claim 9, wherein the conductive particles are uniformly distributed in the conductive adhesive.

13. The display panel of claim 9, wherein the conductive adhesive further comprises a plurality of supporting particles, material of the plurality of supporting particles comprises an organic polymer material, and each of the plurality of supporting particles has a spherical shape.

14. The display panel of claim 13, wherein the supporting particles are uniformly distributed in the conductive adhesive.

15. The display panel of claim 1, wherein the second electrode is a cathode and is an integral continuous electrode layer.

16. The display panel of claim 1, wherein the second electrode has a thickness of from 10 to 1000 angstroms; and material of the second electrode comprises one of magnesium, aluminum or silver.

17. The display panel of claim 1, wherein the package substrate further comprises a transparent insulating layer between the conductive layer and the photodetecting layer.

18. The display panel of claim 1, wherein the display panel comprises an OLED display panel, the electroluminescent layer comprises an organic light-emitting layer.

19. A method of fabricating a display panel, comprising:

providing a first base substrate;

forming a first electrode, an electroluminescent layer and a second electrode on the first base substrate in sequence to form a display substrate;

providing a second base substrate;

forming a conductive layer on the second base substrate to form a package substrate; and bonding the display substrate with the package substrate by a conductive adhesive such that the conductive layer is electrically connected with the second electrode, wherein the package substrate further comprises:

a photodetecting layer on a side of the conductive layer adjacent to the second base substrate, wherein the photodetecting layer is configured to receive light generated by the electroluminescent layer and transmitted through the second electrode.

* * * * *